United States Patent [19]
Marsh et al.

[11] Patent Number: 5,330,360
[45] Date of Patent: Jul. 19, 1994

[54] MEMORY CARD AND CONNECTOR THEREFOR

[75] Inventors: Edward K. Marsh, Kernersville; Riley K. Barker, Lexington, both of N.C.

[73] Assignee: The Whitaker Corporation, Wilmington, Del.

[21] Appl. No.: 933,321

[22] Filed: Aug. 21, 1992

[51] Int. Cl.[5] .................... H01R 9/09; H01R 13/648
[52] U.S. Cl. ..................................... 439/76; 235/492; 439/95; 439/542
[58] Field of Search ................ 439/76, 95, 282, 542, 439/555, 562, 567, 752; 361/395, 399; 235/492

[56] References Cited
U.S. PATENT DOCUMENTS

| | | | |
|---|---|---|---|
| 4,811,165 | 3/1989 | Currier et al. | 439/76 |
| 4,872,091 | 10/1989 | Maniwa et al. | 361/424 |
| 4,924,076 | 5/1990 | Kitamura | 235/492 |
| 5,005,106 | 4/1991 | Kiku | 361/424 |
| 5,040,996 | 8/1991 | Kobold et al. | 439/76 |
| 5,053,199 | 10/1991 | Keiser et al. | 439/76 |
| 5,124,888 | 6/1992 | Suzuki et al. | 439/76 |
| 5,187,642 | 2/1993 | Garner et al. | 361/395 |
| 5,187,643 | 2/1993 | I-Shou | 439/76 |
| 5,207,586 | 5/1993 | MacGregor et al. | 439/76 |

OTHER PUBLICATIONS

AMP Product Specification 108-5286, Memory/PC Card Connector, 1991.

Primary Examiner—P. Austin Bradley
Attorney, Agent, or Firm—William B. Noll

[57] ABSTRACT

Input/output memory cards for use with computers and computer-related equipment. The cards (10) comprise connectors (40) adapted to mate with a printed circuit board (30) interfacing data from the printed circuit board to an outside environment which will utilize the memory card, lateral receiving pockets (50) on a frame (20) in the memory card for locking the connector to the frame and providing structural integrity to the memory cards, and interlocking tabs (60) integrally disposed on the connector and further adapted to mechanically interface with the lateral receiving pockets (50) for securely locking the connector to the frame and providing structural integrity to the memory card when the connector is mounted to the printed circuit board and mated to the frame. Memory cards in accordance with the present invention have significantly improved structural integrity as compared to prior memory cards. The cards are therefore rugged and easily interchangeable with a variety of different computers and computer-related equipment, thereby reducing the overall cost to users of the memory cards.

7 Claims, 4 Drawing Sheets

MEMORY CARD AND CONNECTOR THEREFOR

FIELD OF THE INVENTION

This invention relates generally to memory cards for use with computer and computer-type equipment. More specifically, this invention relates to methods and apparatus for locking a memory card together to provide structural integrity to the card.

BACKGROUND OF THE INVENTION

With the advent of sophisticated computers, facsimile machines, printers, and other computer-related electronics equipment, the need for external memory storage of important data to be used by the computer and computer-related equipment is ever increasing. To this end, memory cards containing external memory and data to be used in computer processes have been designed. Examples of such memory cards are shown in U.S. Pat. No. 5,005,106—Kiku, and U.S. Pat. No. 4,872,091—Maniwa et al., the teachings of both being specifically incorporated herein by reference. Such memory cards are useful for printers, copiers, word processors, telefax machines, and other electronic equipment which require an external memory.

As shown in the Kiku and Maniwa et al. patents, memory cards generally comprise a printed circuit board, a casing made of an insulating material for housing the printed circuit board, and at least one connector. The connector is typically provided on one end of the casing for interfacing the memory card, and particularly the printed circuit board contained in the casing, to the computer equipment to which the card is mated. The connector is generally denoted an "input/ output" or "I/O" connector and is designed to extract the contents of the memory stored on the printed circuit board and to bus data to and from an outside environment, which also usually comprises a computer or other electronic equipment. In this fashion, data traverses the interface between the memory card and the outside environment so that the data can be efficiently transferred and used by the computer to which the card is mated for its intended purpose.

Memory cards are generally interchangeable and can be used with many different machines and electronic components. Because the memory cards are interchangeable, they undergo a significant amount of abuse when transported, interfaced and mated to the different computers and electronic equipment which use them. Since a memory card is conventionally made up of a number of layers and/or elements glued or otherwise bonded together, the individual layers tend to become loose and/or separated from one another as the memory card is subject to flexing stress, as typically occurs when the card is inserted into or removed from the electronic or other computer-type equipment. Thus, even after moderate amounts of usage, conventional memory cards have heretofore frequently become structurally loose, and the internal members of the card often become misaligned. This results in failure of the memory card and degrades the performance of the electronic equipment which uses the card. These undesirable results generally induce poor performance of the computer system which uses the memory card.

Accordingly, applicants have recognized that it would be desirable to provide a memory card having sufficient structural integrity to withstand prolonged and frequent mating and demating with different pieces of electronic equipment. It is also desirable that a memory card provide such structural superiority without sacrificing performance of the memory card. Furthermore, it is desirable that such memory cards be constructed from standard equipment using elements which require little modification to provide structural integrity to the card. These objects have not heretofore been achieved in the art.

SUMMARY OF THE INVENTION

The foregoing objects are achieved, and the deficiencies of the prior art overcome, by memory cards and connectors provided in accordance with the present invention. The present invention generally provides improved memory cards of the type having a frame for housing a circuit element. The memory cards comprise connector means for interfacing data between the circuit element and an outside environment which will utilize the memory card, the connector means comprising mating means for mechanically interfacing the connector means to the frame. The memory card also comprises mating means on the frame for mechanically interfacing with the connector mating means such that the connector means provides structural integrity to the memory card when the frame and connector means are mated. According to preferred embodiments of the present invention, the connector mating means comprises interlocking means, such as tabs, and the frame mating means comprises receiving means for snugly receiving the tabs and locking the connector means to the frame.

Additionally, the method aspects of the present invention provide processes for imparting improved structural integrity to a memory card. The methods preferably comprise the steps of mating a circuit element to a partially rigid frame to form a partial memory card, interfacing a connector to the circuit element to provide an interface to the partial memory card, and mechanically interfacing mating means on the connector to mating means on the frame so as to provide rigidity to the frame and to give the memory card structural integrity.

The methods and devices described and claimed herein provide efficient means for giving memory cards exceptional structural integrity. By mechanically interfacing a connector mating means, such as a tab, with a frame mating means, such as a socket or pocket on the frame adapted to receive the tab, the memory card is provided with structural integrity. Furthermore, such memory cards are adaptable for use with many different computer and computer-type components without degradation or misalignment of the internal components of the card. This further ensures flexible and economic operation of electronic devices utilizing memory cards in accordance with the present invention. Furthermore, since memory cards described and claimed herein resist structural loosening upon mating and demating with electronic equipment, it is possible for the user of the memory cards to purchase fewer of these cards and to use the cards in a number of different devices in an office, laboratory, or other installation where the cards and computer devices are operated. This provides great equipment cost savings and economy.

DETAILED DESCRIPTION OF PREFERRED EMBODIMENTS

Figure 1:
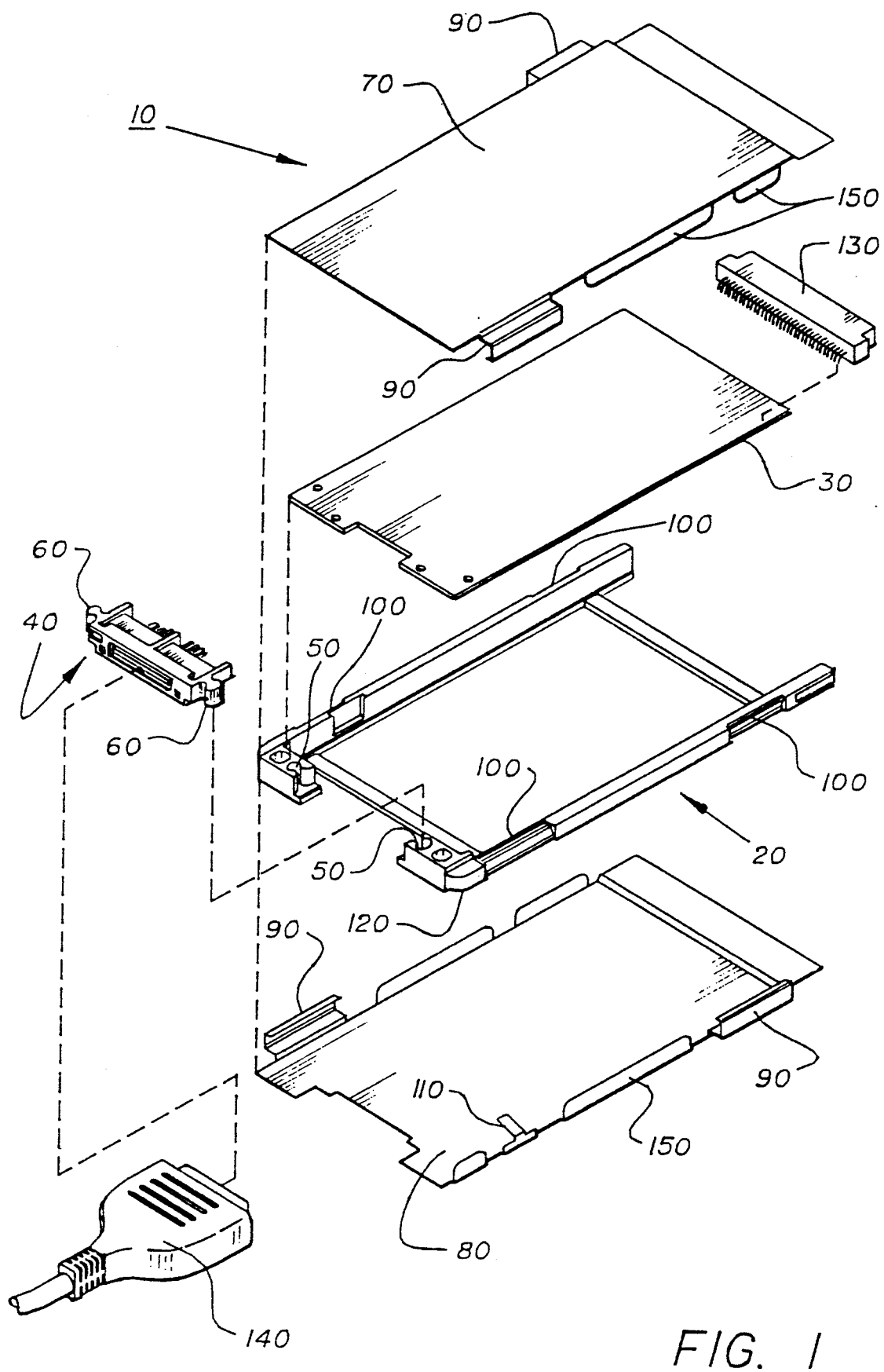
FIG. 1 is a perspective, exploded view of an input/output memory card provided in accordance with one embodiment of the present invention.

Referring now to the drawings wherein like reference numerals refer to like elements, FIG. 1 is an exploded isometric view of a memory card shown generally at 10 having a metal frame 20 for housing a circuit element 30. The circuit element 30 may be, for example, a printed circuit board, a printed wiring board or simply a semi-conductor substrate. It will be recognized by those with skill in the art that any circuit element adaptable for storing, receiving and/or transmitting data can be housed in memory card 10. For ease of description throughout, circuit element 30 will be referred to as a "printed circuit board," but this should not be construed as in any way limiting the present invention.

Memory card 10 further comprises a connector means 40 for interfacing data between an outside environment, such as a computer or computer-related electronic device (not shown), and printed circuit board 30, which will store data in memory card 10. Because connector means 40 is adapted to interface data between the printed circuit board and the computer or computer-related electronic device, it is therefore sometimes referred to as an "input/output" connector. It will be recognized by those with skill in the art that the present invention is not limited to such input/output connectors and is equally applicable to other kinds of connectors which interface with circuit elements generally.

One aspect of the present invention resides in the configuration of connector means 40 and frame 20. In particular, connector means 40 comprises mating means 60 for mechanically interfacing with mating means 50 on frame 20 such that the connector means provides structural integrity to the memory card when it is mated to the frame, as described more fully hereinafter.

The memory card 10 also preferably comprises cover means in sealing engagement with the frame 20 for protecting printed circuit board 30 in the frame. As illustrated in the figures, the cover means comprises a top cover 70 and bottom cover 80 attached to frame 20 so as to permanently seal printed circuit board 30 within memory card 10 and to protect the printed circuit board from external pollutants, such as dust, as well as from stray electromagnetic fields. The top and bottom covers also tend to supply additional structural rigidity to the card, but, typically these covers provide insufficient rigidity to ensure that the card maintains structural integrity during operation. In a further preferred embodiment, the memory card comprises grounding means integrally attached to the cover means for grounding the printed circuit board 30 to the memory card 10.

A pair of press-fit tabs 90 preferably protrude from opposite longitudinal sides of top cover 70 and are adapted to mate with corresponding press-fit openings 100 located on the sides of frame 20. The bottom cover 80 is also preferably provided with press-fit tabs 90 to mate with corresponding press-fit openings 100 on frame 20. In operation, the entire memory card 10 is grounded to, for example, a computer through spring contacts 120 which are attached to the forward corners of frame 20. In this fashion, the memory card is grounded to the chassis of the computer or other electronic device in which it is placed for operational purposes.

It is preferred that a grounding tab (not shown) is attached to, and preferably integrally formed on, bottom cover 80. According to preferred embodiments, a grounding tab 110 (not shown) is also attached to, and preferably integrally formed on, top cover 70. Tabs 110 are adapted to ground the printed circuit board 30 to frame 20. Top cover 70 and bottom cover 80 preferably each comprise a substantially conductive material which grounds memory card 10 to the electronic device to which it is mated. The grounding tab is preferably integrally formed on cover 70 similar to the grounding tab 110 on bottom cover 80. The tabs are adapted to interface with the printed circuit board 30 when covers 70 and 80 are in place on the memory card 10 to seal the printed circuit board in the memory card. In a further preferred embodiment, a plurality of side tabs 150 are also integrally formed as part of covers 70 and 80 and act to align the covers on the memory card 10 to further promote efficient sealing of the printed circuit board 30 in the memory card.

When covers 70 and 80 are sealed to the printed circuit board 30, the grounding tabs 110 preferably interface with the printed circuit board and ground the printed circuit board 30 to the memory card. This grounding arrangement is accomplished since the press-fit protrusions 90 mate securely with the reciprocal openings 100 on the frame to tightly mount covers 70 and 80 to frame 20 so that the grounding tabs 110 are substantially flattened or pinched against the printed circuit board 30, thereby making good grounding contact.

Memory card 10 further comprises a second connector means 130 for mating the card to a computer or other device (not shown) which will utilize the card's memory and/or perform computer operations on data which is stored in the memory card and/or received from the outside environment through connector means 40. In general, computer connector 130 is of a two-piece construction comprising a posted header for loading onto the host equipment, such as a computer, and a receptacle assembly which is used by the memory card 10. Such a connector is described in AMP Inc. (Harrisburg, Pa.) Product Specification 108-5287, entitled "Memory/PC Card Connector," dated 1991, the teachings of which are specifically incorporated herein by reference.

The operation of memory card 10 is in general known to those skilled in the art. Memory modules (not shown)

are mounted on printed circuit board 30 and contain data to be used by the computer or other device in which memory card 10 is mated. Communication of data between the printed circuit board 30 and the computer in which card 10 is mated occurs through computer connector 130 located on the end of memory card 10 opposite the end carrying connector 40. As mentioned above, the connector 40 is preferably adapted to interface printed circuit board 30 with an outside environment such as another computer or electronic device, for example a telefax machine.

Since memory card 10 is preferably capable of interfacing data to and from an outside environment, yet a third connector 140 is utilized to accomplish this task. Third connector 140 is an input/output connector which interfaces with the outside environment so that data can be transferred between the outside environment and memory card 10. In this fashion, data can be transferred between memory card 10 and the outside environment through connectors 40 and 140 and further interfaced to the computer or other device through computer connector 130 so that efficient data communication is accomplished.

As described herein before, many prior memory cards lack sufficient structural integrity to allow reliable use in multiple computer devices. Prior memory cards have also been found to be unreliable in applications in which it is desired or required for the card to be inserted and reinserted into a computer or other electronic component with regularity. In accordance with preferred aspects of the present invention, connector means 40 and frame 20 interact to provide added stability, strength and ruggedness to the memory card 10. This benefit is achieved, in large part, by the provision of cooperative mating means 50 and 60 on frame 20 and connector means 40, respectively. The cooperative mating means of the present invention preferably provide one or more mating surfaces, such as shoulders, ledges, bumps, ridges and the like, which together substantially restrict relative lateral and longitudinal motion between the connector means and the frame. In this way, connector means 40 is mechanically locked into frame 20, thereby imparting added structural rigidity and integrity to the structure. Connector mating means 60 and frame mating means 50 together comprise locking means for locking and mounting the connector means 40 to frame 20.

Figure 2B:
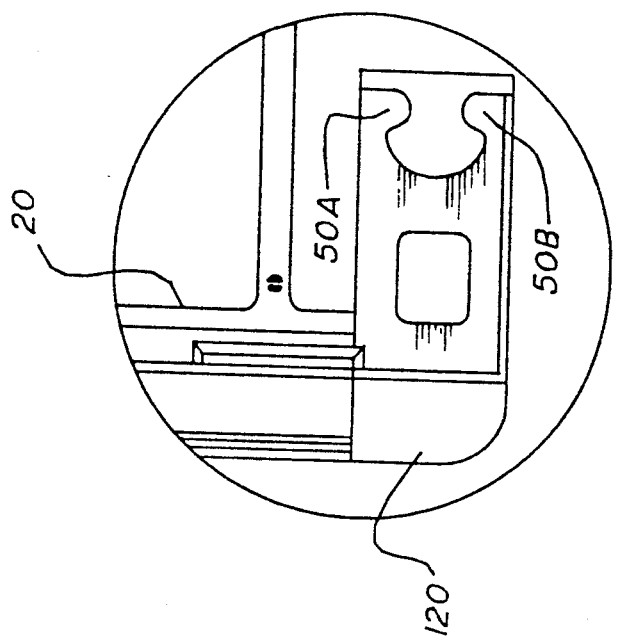
FIG. 2B is a partial plan view of the frame portion of a memory card showing a jigsaw receptacle according to one embodiment of the present invention.
Figure 2A:
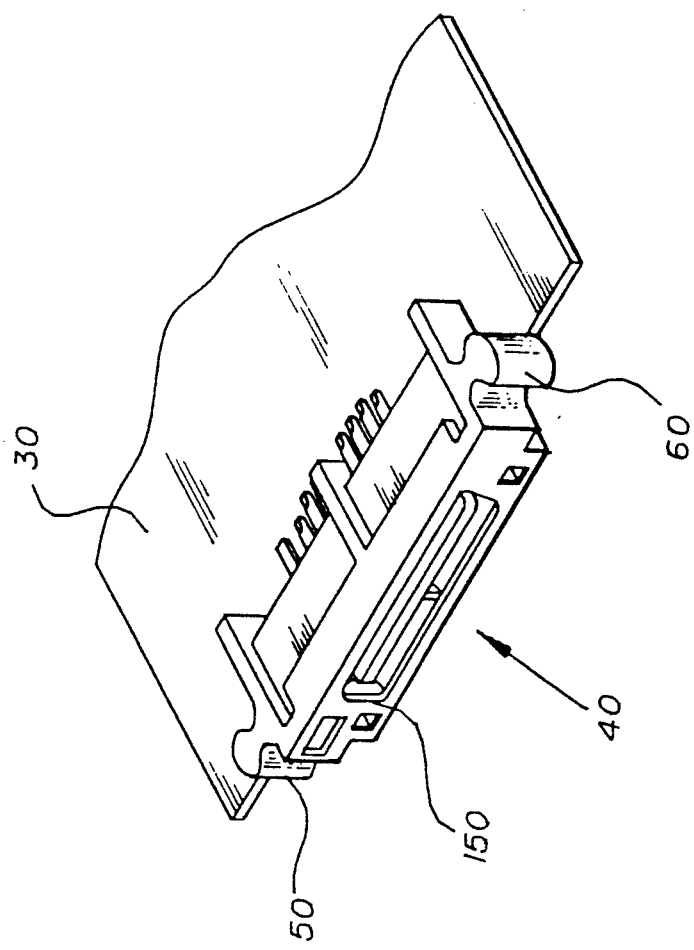
FIG. 2A is an isometric view of an input/output connector provided in accordance with one embodiment of the present invention that is surface mounted to a printed circuit board for use in a memory card.
Figure 4:
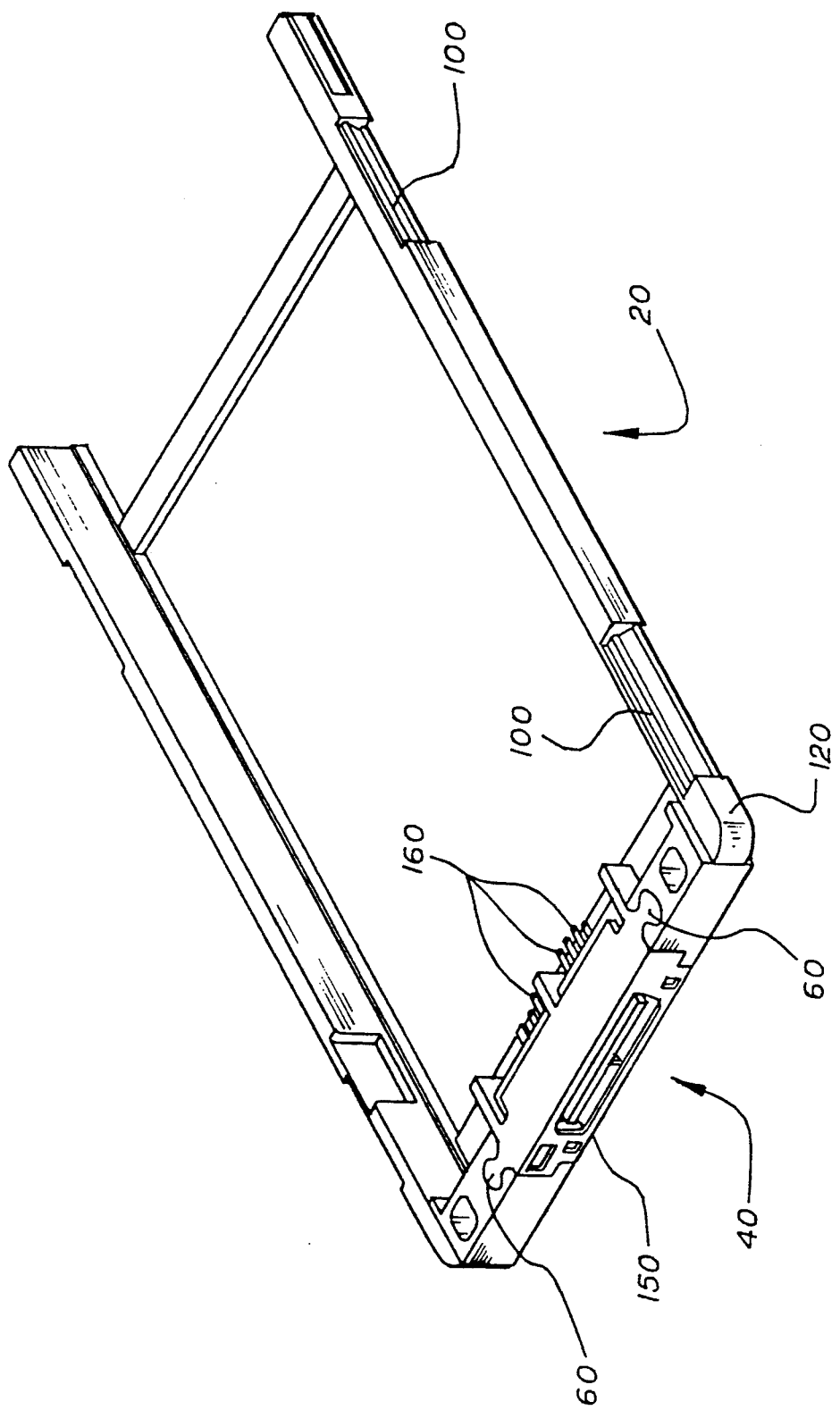
FIG. 4 is an isometric view of an input/output connector according to one embodiment of the present invention having a jigsaw tab mated in a reciprocal receiving jigsaw aperture in the frame of a memory card.

Connector mating means 60 comprises at least one interlocking tab, and frame mating means 50 comprises at least one receiving means adapted to receive the interlocking tab. With particular reference now to FIGS. 1, 2 and 4, interlocking tab 60 preferably comprises first and second "jigsaw" tabs formed on each lateral side of connector means 40. The jigsaw tabs are preferably fabricated from the same material as a housing 150 which further comprises input/output connector 40. The mating means 60 are called "jigsaw tabs" since they preferably resemble interlocking elements of the type found in common jigsaw puzzle pieces. Frame mating means 50 preferably comprises receiving means 60 for securely and snugly receiving mating means 60. As shown in the figures, mating means 50 preferably comprises first and second jigsaw receptacles or pockets having a shape corresponding to jigsaw tabs 60. The jigsaw tabs 60 are preferably formed to be just slightly larger than means 50 so as to produce a snug interference fit according to manufacturing techniques known in the art.

It will be appreciated by those skilled in the art that numerous variations and modifications of the mating means illustrated in the figures are possible within the scope of the present invention. For example, it is contemplated that the connector mating means may comprise a receiving means, in which case the frame will carry a corresponding interlocking tab. Furthermore, it is contemplated that it may be desirable in certain embodiments for the connector mating means to comprise at least one interlocking tab and at least one receiving means. In such embodiments, the frame mating means comprises its own receiving means for accepting the connector jigsaw tab and its own jigsaw tab for interlocking with the receiving means on the connector. In view of the disclosure contained herein, numerous other variations will be apparent to those skilled in the art.

It will also be appreciated by those skilled in the art that the interlocking tab and the corresponding receiving means of the present invention may provide interfacing surfaces in numerous shapes and sizes. For example, it is contemplated that the bulbous jigsaw tab 60 shown in the figures may be replaced or supplemented by an interlocking tab in the form of a star shaped projection. Interlocking tabs in the form of other shapes, both regular and irregular, are possible within the scope of the present invention. In general, it is only required that the interlocking tabs and the receiving means therefor provide one or more mating surfaces which together substantially restrict, and preferably prevent, relative longitudinal and lateral motion between the connector means and the frame.

When mated to frame 20, connector 40 provides structural integrity to memory card 10 since it imparts significant rigid structure to the frame. Initially frame 20 is only partially rigid, and when mated to the printed circuit board 30, the frame and printed circuit board form the partial memory card. By mechanically interfacing the connector means 40 to the partial memory card, the locking of jigsaw tabs 60 to the corresponding jigsaw receptacles 50 provides further rigidity to frame 20. As a result, memory card 10 is provided with substantial structural integrity as compared to prior memory cards having frames which do not comprise the connectors described herein.

Figure 3A:
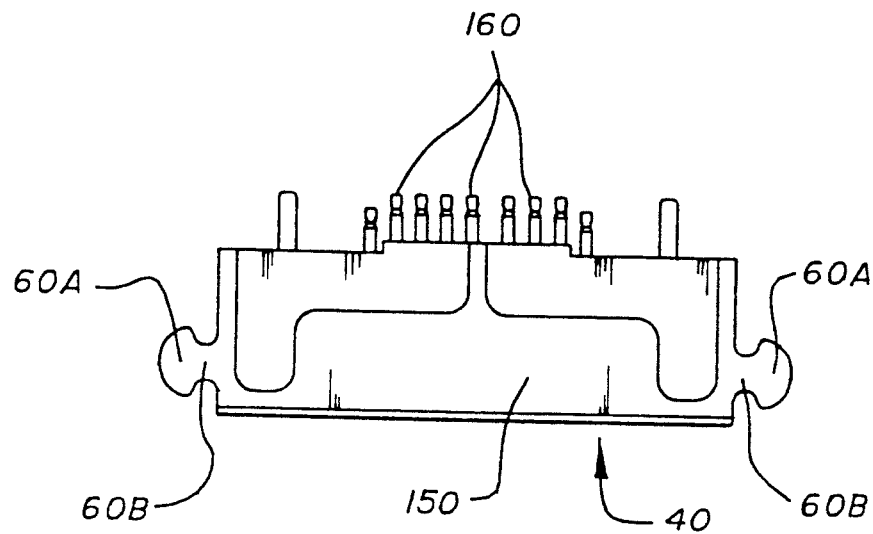
FIGS. 3A and 3B are plan and elevation views of an input/output connector showing jigsaw tabs provided in accordance with one embodiment of the present invention to provide structural integrity to a memory card.
Figure 3B:
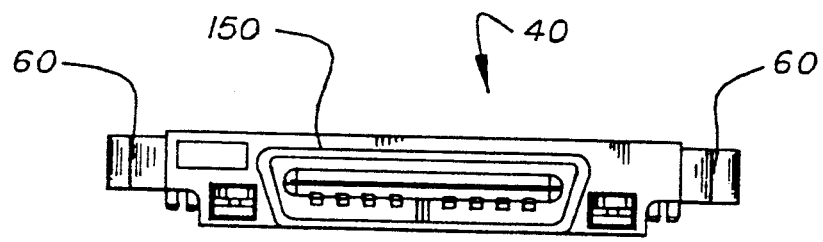

Referring to FIGS. 3A and 3B, plan and elevational views, respectively, of preferred connector means 40 are illustrated. The connector 40 comprises housing 150 and first and second jigsaw tabs 60 projecting from lateral or side portions of the housing. The jigsaw tabs preferably comprise a bulbous portion 60A attached to housing 150 by stem portion 60B. The area of connection between stem 60B and bulbous portion 60A form two outer shoulders. Two inner shoulders are formed at the area of connection between the stem 60B and housing 150. As shown in FIG. 2B, receiving means 50 comprises a socket formed, in part, by ledges 50A and 50B which mechanically interface with the shoulder portions described above. This mechanical interface between the shoulder portions of the connector means 40 and ledges 50A and 50B is largely responsible for substantially restricting lateral and longitudinal movement between the connector and the frame. The other mating surfaces of the tab 60 and the socket 50 likewise contribute to restricting relative movement between the connector means 40 and frame 20.

Housing 150 preferably comprises a glass-filled polycarbonate material which can be injection molded by known injection molding techniques such that jigsaw tabs 60 are integral parts of housing 150 on lateral or side portions of the housing. Jigsaw tabs 60 which will interface and mate with the jigsaw receptacles 50 on frame 20 therefore also preferably comprise a glass-filled polycarbonate material and are integrally formed with the housing 150 during the molding process.

Input/output connector 40 preferably comprises a plurality of terminals, shown generally at 160, adapted to be surface mounted to the printed circuit board 30 in input/output memory card 10. Terminals 160 are preferably 0.25 centimeters thick and are preferably plated with 1.27 micrometers of phosphor bronze plating to make good surface and electrical contact with printed circuit board 30.

Referring to FIG. 4, an isometric, plan view illustrating the mating of a jigsaw tab 60 with a jigsaw retaining receptacle 50 is illustrated. By securely mating jigsaw tab 60 in jigsaw receptacle 50, significant structural integrity is achieved for frame 20. It is believed that frame 20 having jigsaw receptacles mated with jigsaw tabs in accordance with the present invention will achieve at least about 50% more rigidity than prior frames which lack the connector means described in accordance with the present invention. This evinces a significant improvement in the total structural integrity of memory card 10 and greatly facilitates the use and interchangeability of memory cards provided in accordance with the present invention with computer. Thus, the memory cards and connectors of the present invention provide improved durability, and greatly reduce the costs of providing external memories to computer equipment, and facilitate the efficiency of installations using these devices.

There have thus been described memory cards and connectors provided in accordance with the present invention. It will be recognized by those with skill in the art that modifications are within the true spirit and scope of the invention. The appended claims are intended to cover all such modifications.

What is claimed is:

1. A memory card of the type having a frame for housing a circuit element comprising:
   connector means for interfacing data between the circuit element and an outside environment which will utilize the memory card, said connector means comprising mating means for mechanically interfacing said connector means to the frame;
   mating means on the frame for mechanically interfacing with said connector mating means, said frame mating means and said connector mating means being mechanically interfaced such that the structural integrity of the card is enhanced;
   cover means in sealing engagement with the frame for securing the circuit element in the frame; and
   grounding means integrally attached to the cover means for grounding the circuit element to the memory card.

2. The memory card recited in claim 1 wherein said connector means is located on a first end of the memory card for communicating data between the circuit element and a computer in which the memory card is mated.

3. The memory card recited in claim 1 wherein the frame is at least about 50% more rigid after said frame mating means is mechanically interfaced with said connector mating means.

4. The memory card recited in claim 1 wherein said connector mating means comprises an interlocking tab and said frame mating means comprises receiving means for receiving said interlocking tab.

5. The memory card recited in claim 4 wherein said connector means further comprises a housing having lateral sides, and said interlocking tab comprises a first interlocking tab integrally formed on a first of said lateral sides and second interlocking tab integrally formed n a second of said lateral sides.

6. The memory card recited in claim 5 wherein the interlocking tab comprises a jigsaw tab on each lateral side of the connector means, said jigsaw tabs being securely held within said receiving means.

7. The memory card recited in claim 6 wherein the receiving means comprises jigsaw pockets.

* * * * *